(12) United States Patent
Lee

(10) Patent No.: US 7,833,899 B2
(45) Date of Patent: Nov. 16, 2010

(54) MULTI-LAYER THICK METALLIZATION STRUCTURE FOR A MICROELECTRONIC DEVICE, INTERGRATED CIRCUIT CONTAINING SAME, AND METHOD OF MANUFACTURING AN INTEGRATED CIRCUIT CONTAINING SAME

(75) Inventor: Kevin J. Lee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/214,747

(22) Filed: Jun. 20, 2008

(65) Prior Publication Data

US 2009/0315180 A1 Dec. 24, 2009

(51) Int. Cl.
*H01L 21/4763* (2006.01)
(52) U.S. Cl. .................. 438/622; 438/679; 438/637; 438/597; 257/E21.006; 257/E21.17; 257/E21.021; 257/E21.229; 257/E21.242
(58) Field of Classification Search ................. 438/622, 438/597, 598, 637, 685, 687, 706, 745, 679, 438/780, 782; 257/E21.006, 17, 21, 229, 257/242
See application file for complete search history.

(56) References Cited

U.S. PATENT DOCUMENTS

| | | | | |
|---|---|---|---|---|
| 6,005,291 | A * | 12/1999 | Koyanagi et al. | ........... 257/751 |
| 6,020,266 | A | 2/2000 | Hussein | |
| 6,137,176 | A * | 10/2000 | Morozumi et al. | .......... 257/751 |
| 6,144,095 | A * | 11/2000 | Sandhu et al. | .............. 257/750 |
| 6,384,481 | B1 * | 5/2002 | Hussein et al. | .............. 257/750 |
| 6,943,440 | B2 | 9/2005 | Kim | |
| 6,977,435 | B2 | 12/2005 | Kim | |
| 2005/0017361 | A1 | 1/2005 | Lin et al. | |
| 2006/0012039 | A1 | 1/2006 | Kim | |
| 2006/0076678 | A1 | 4/2006 | Kim et al. | |
| 2007/0190776 | A1 | 8/2007 | Kim | |
| 2008/0122078 | A1 | 5/2008 | He | |

FOREIGN PATENT DOCUMENTS

WO 2009/155160 A2 12/2009

OTHER PUBLICATIONS

Ingerly, D., et al., "Low-K Interconnect Stack with Thick Metal 9 Redistribution Layer and Cu Die Bump for 45nm High Volume Manufacturing", Logic Technology Development, Materials, Quality & Reliability, 2008 IEEE, pp. 216-218.

Moon, Peter, et al., "Process and Electrical Results for the On-die Interconnect Stack for Intel's 45nm Process Generation", Intel's 45nm CMOS Technology, Intel Technology Journal, vol. 12, Issue 02, Jun. 17, 2008, ISSN: 1535-864X, DOI: 10.15-1535/itj.1202.02, 8 pgs.

(Continued)

*Primary Examiner*—David Nhu
(74) *Attorney, Agent, or Firm*—Kenneth A. Nelson

(57) ABSTRACT

A multi-layer thick metallization structure for a microelectronic device includes a first barrier layer (111), a first metal layer (112) over the first barrier layer, a first passivation layer (113) over the first metal layer, a via structure (114) extending through the first passivation layer, a second barrier layer (115) over the first passivation layer and in the via structure, a second metal layer (116) over the second barrier layer, and a second passivation layer (117) over the second metal layer and the first passivation layer.

10 Claims, 4 Drawing Sheets

OTHER PUBLICATIONS

K. Mistry et al., A 45nm Logic Technology with High-k+ Metal Gate Transistors, Strained Silicon, 9 Cu Interconnect Layers, 193nm Dry Patterning, and 100% Pb-free Packaging, Electron Devices Meeting 2007, IEDM 2007, IEEE International, Dec. 10-12, 2007, pp. 247-250.

Peter Elenius, "The Ultra CSP Wafer Scale Package"; Flip Chip Technologies; IEEE 1998; Electronics Packaging Technology Conference; pp. 83-88.

International Search Report and Written Opinion received for PCT Application No. PCT/US2009/046627, mailed on Dec. 29, 2009, 11 pages.

* cited by examiner

MULTI-LAYER THICK METALLIZATION STRUCTURE FOR A MICROELECTRONIC DEVICE, INTERGRATED CIRCUIT CONTAINING SAME, AND METHOD OF MANUFACTURING AN INTEGRATED CIRCUIT CONTAINING SAME

FIELD OF THE INVENTION

The disclosed embodiments of the invention relate generally to integrated circuits and their manufacture, and relate more particularly to integrated circuit metallization stacks.

BACKGROUND OF THE INVENTION

Integrated circuit (IC) packages traditionally include various metal layers interspersed with via structures forming what may be referred to as a metallization stack. This metallization stack provides power and other necessary electrical connections to underlying active devices such as transistors and the like. An emerging trend in microprocessor design is to bring additional functionality from the chipset onto the central processing unit (CPU) and this trend, along with other factors adding to the performance demand on the CPU, requires increasing numbers of signal connections on the die. This increase, along with decreasing die sizes, means that the technology is rapidly approaching a point where it will no longer be practical to place all of the signal connections around the perimeter of the die, and hence at least some of the signal connections must be placed in the middle of the die.

One way to form some of the required signal connections in the middle of the die would be to fabricate an additional thick metal layer in the metallization stack using the same process flow that is currently used for fabricating the existing thick metal layer in the metallization stack. This existing thick metal layer process flow is discussed in, for example, K. Mistry et al., *A 45nm Logic Technology with High-k+ Metal Gate Transistors, Strained Silicon, 9 Cu Interconnect Layers, 193 nm Dry Patterning, and 100% Pb-free Packaging*, Electron Devices Meeting 2007, IEDM 2007, IEEE International, 10-12 Dec. 2007, pp. 247-250. However, adding another thick metal layer using this process flow is unworkable for high volume manufacturing because of wafer bow issues and maximum process temperature restrictions for passivating the thick metallization layer.

BRIEF DESCRIPTION OF THE DRAWINGS

The disclosed embodiments will be better understood from a reading of the following detailed description, taken in conjunction with the accompanying figures in the drawings in which.

Figure 1:
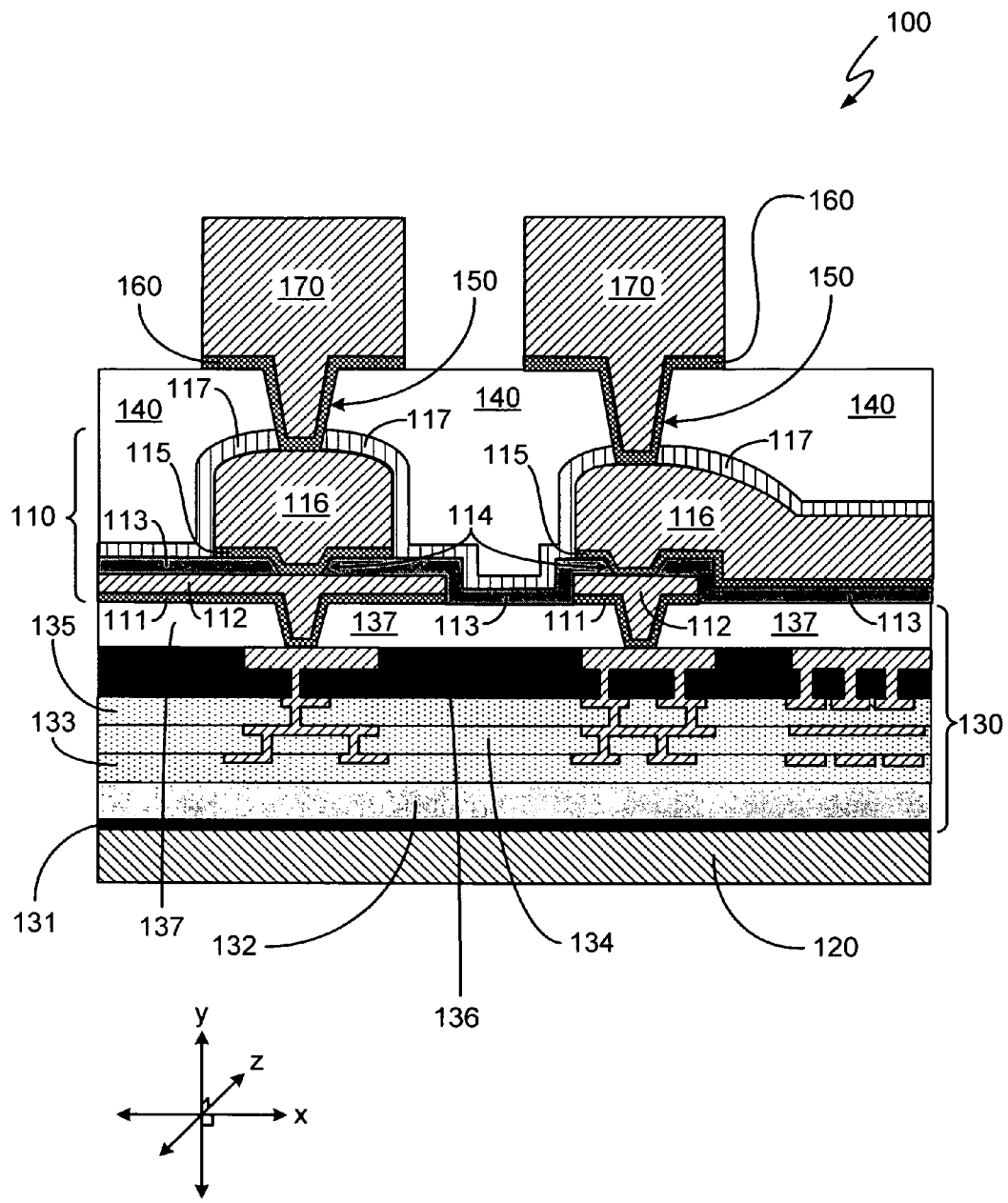
FIG. 1 is a cross-sectional view of an integrated circuit containing a multi-layer thick metallization structure according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a multi-layer thick metallization structure for a microelectronic device comprises a first barrier layer, a first metal layer over the first barrier layer, a first passivation layer over the first metal layer, a via structure extending through the first passivation layer, a second barrier layer over the first passivation layer and in the via structure, a second metal layer over the second barrier layer, and a second passivation layer over the second metal layer and the first passivation layer. The described metallization structure forms a part of a metallization stack associated with an integrated circuit.

It was mentioned above that it is very difficult to use the existing thick metal process flow for the formation of a second thick metal layer because of wafer bow issues and maximum passivation temperature restrictions. More specifically, when the existing thick metal process flow is used a second time, the presence of the second thick metallization layer and the second cured spin-on polymer inter-layer dielectric (ILD) material causes the wafer edges to bow upwards beyond what the robots on the process equipment can accommodate. The wafer bow originates from internal stress build-up within the dielectric material and the thick metal lines when the spin-on dielectric material is cured.

Additionally, the second thick metal layer needs to be passivated in order to meet electromigration requirements and so that the second layer of spin-on dielectric material will adhere well to the second thick metal layer lines. Nitride is a preferred passivation film, but plasma-enhanced chemical vapor deposition (PECVD) nitride films are typically deposited at temperatures of approximately 400 degrees Celsius (° C.) and the spin-on dielectric material that is already present on the first thick metal layer stack cannot tolerate exposure to temperatures of this magnitude, as it begins to decompose at approximately 275° C.

In order to overcome the foregoing issues, embodiments of the invention use a metallization stack containing a thick metallization structure that combines a patterned sputtered metal layer with a plated metal layer. As an example, the patterned sputtered metal layer may be used for global signal distribution and the plated metal layer may be used for on-die power distribution, though it should be understood that the functions of these layers may also be reversed, or the layers may be used for other purposes. Accordingly, embodiments of the invention enable the successful fabrication of a second thick metal layer while avoiding the wafer bow and low temperature passivation problems that are encountered when forming a second thick metal layer using the existing thick metallization process flow. Furthermore, embodiments of the invention enable the formation of a second thick metal layer at lower cost than what is possible using the existing thick metallization process flow or a dual damascene process.

Still further, the thick metallization structure according to embodiments of the invention gives better underlying low-k inter-layer dielectric (ILD) protection than would existing structures because of the presence of an additional thick metal layer and an additional layer of nitride. These structures will be further described below. Regarding the above mention of a low-k material, it is noted that silicon dioxide ($SiO_2$), which was widely used in the past as a gate dielectric, has a dielectric constant K (often written as "k") of approximately 3.9. References in this document to "low-k" materials are references to materials having dielectric constants that are low relative to that of $SiO_2$, e.g., materials having dielectric constants less than approximately 3.5 such as (but not limited to) carbon-doped silicon oxide (CDO), organosilicate glass (OSG), and hydrogenated silicon oxycarbides (also commonly referred to as SiOC:H materials).

Referring to the drawings, FIG. 1 is a cross-sectional view of an integrated circuit 100 containing a multi-layer thick metallization structure 110 according to an embodiment of the invention. As illustrated in FIG. 1, multi-layer thick metallization structure 110 comprises a barrier layer 111, a metal layer 112 over barrier layer 111, a passivation layer 113 over metal layer 112, and a via structure 114 extending through passivation layer 113. Multi-layer thick metallization structure 110 further comprises a barrier layer 115 over passivation layer 113 and in via structure 114, a metal layer 116 over barrier layer 115, and a passivation layer 117 over metal layer 116 and passivation layer 113.

As an example, barrier layer 111 can comprise titanium (Ti), tantalum (Ta), tantalum nitride (TaN), titanium nitride (TiN), titanium tungsten (TiW), or the like. In certain embodiments, titanium is preferred because it is the easiest suitable barrier material to integrate into the process flow.

As another example, metal layers 112 and 116 can comprise copper or the like. Copper may be used for metal layers 112 and 116 at least in part because of its excellent electrical conduction properties. In one embodiment, metal layer 112 has a thickness of no greater than approximately 2.5 micrometers (hereinafter "microns" or "μm"), and in a particular manifestation of that embodiment has a thickness of approximately 2 microns. In the same or another embodiment, metal layer 116 has a thickness of at least approximately 2 microns, and in a particular manifestation of that embodiment has a thickness of approximately 7 microns. Among other possible considerations, manufacturing constraints for sputtering and plating processes may to at least some degree determine the thicknesses of metal layers 112 and 116.

As another example, passivation layers 113 and 117 can comprise a passivation film such as $SiO_2$, silicon oxynitride, silicon nitride ($Si_3N_4$), or the like. In one embodiment, passivation layer 113 has a thickness between approximately 0.5 micron and approximately 1 micron. As mentioned above, the presence of metal layer 112 and passivation layer 113 provide protection to underlying low-k inter-layer dielectric (ILD) layers. This protection is due at least in part to the fact that the stated layers act as a stress buffer by distributing package-induced stresses over a wider area than would otherwise be possible. The package-induces stresses arise out of coefficient of thermal expansion (CTE) mismatches between the package materials and the die. This stress buffering effect is a feature that can be important given the fragile nature of the underlying low-k ILD layers.

Referring still to FIG. 1, integrated circuit 100 further comprises a semiconducting substrate 120 having a plurality of wiring layers 130 formed thereon. In one embodiment, semiconducting substrate 120 comprises silicon or the like. Adjacent to substrate 120 are various front end films 131 and backend films 132 followed by a plurality of wiring layers 130. The top-most layer within plurality of wiring layers 130 is layer 137. Layer 137 is referred to elsewhere herein as a "first wiring layer," and is located directly below a lowest portion of multi-layer thick metallization structure 110, i.e., below barrier layer 111. In one embodiment, one or more of layers 133, 134, 135, and 136 contain a low-k ILD material, while in another embodiment layer 136 comprises silicon oxide. In the same or another embodiment, layer 137 comprises silicon nitride.

As illustrated, and as just alluded to above, multi-layer thick metallization structure 110 is located over plurality of wiring layers 130, with barrier layer 111 adjacent to layer 137. Integrated circuit 100 still further comprises an electrically insulating material 140 over passivation layer 117, a via structure 150 extending through electrically insulating material 140 and passivation layer 117, a barrier layer 160 over electrically insulating material 140 and in via structure 150, and an electrically conducting bump 170 over barrier layer 160. As an example, electrically insulating material 140 can comprise a spin-on polymer dielectric material or the like, barrier layer 160 can be similar to barrier layers 111 and 115, and electrically conducting bump 170 can comprise copper or the like.

In the illustrated embodiment, metal layer 112 is oriented in a first direction while metal layer 116 is oriented in a second direction that is substantially perpendicular to the first direction. In the coordinate system of FIG. 1, metal layer 112 has a longest dimension in the x-direction and metal layer 116 has a longest dimension in the z-direction. (It should be noted that the z-direction is the direction directly into and out of the paper. If the coordinate system of FIG. 1 appears to indicate something different for the z-direction it does so for purely illustrative reasons.) This orientation, with metal lines extending across two different dimensions offers good power distribution in two orthogonal directions of integrated circuit 100. This in turn yields less IR drop, lower power consumption, and other circuit design advantages.

Figure 2:
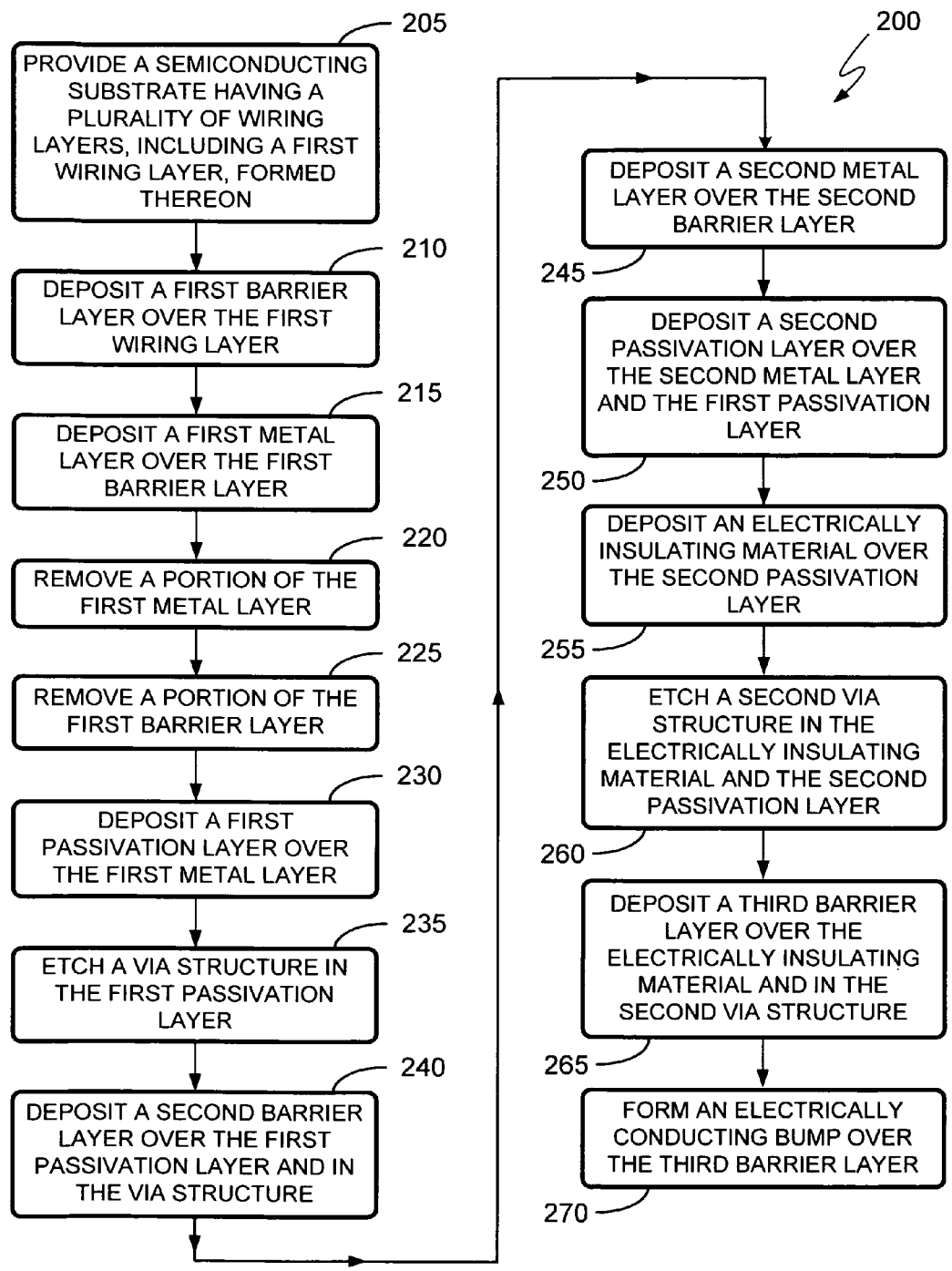
FIG. 2 is a flowchart illustrating a method of manufacturing an integrated circuit according to an embodiment of the invention.

FIG. 2 is a flowchart illustrating a method 200 of manufacturing an integrated circuit according to an embodiment of the invention. As an example, method 200 may result in the formation of an integrated circuit similar to integrated circuit 100 that is shown in FIG. 1.

A step 205 of method 200 is to provide a semiconducting substrate having a plurality of wiring layers, including a first wiring layer, formed thereon. As an example, the plurality of wiring layer can be similar to plurality of wiring layers 130 that are shown in FIG. 1 and the first wiring layer can be similar to layer 137, also shown in FIG. 1.

Figure 3:
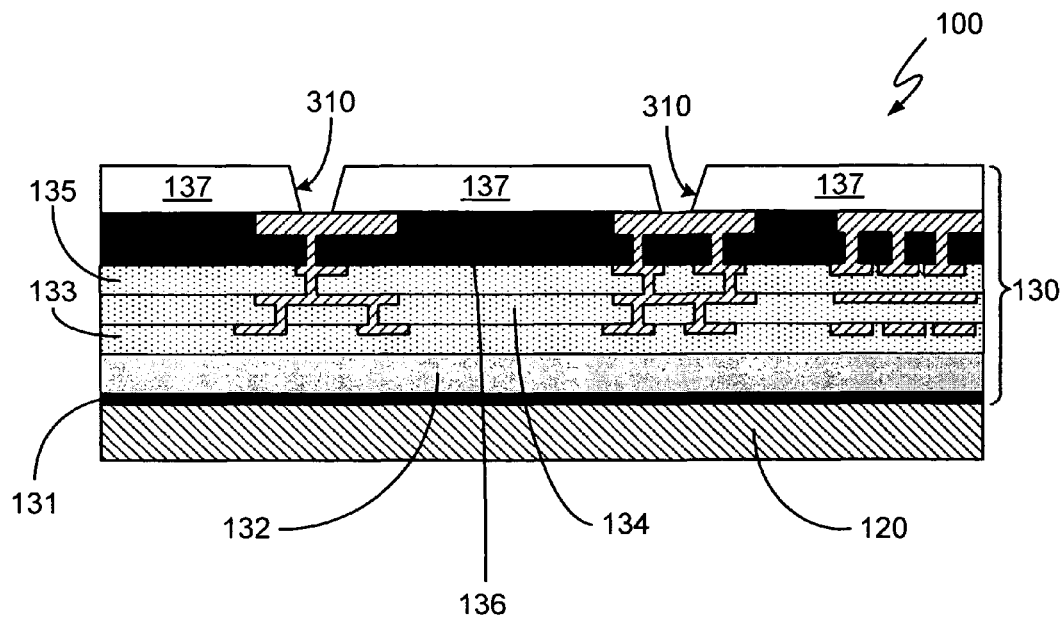
FIGS. 3-6 are cross-sectional views of the integrated circuit of FIG. 1 at various points in its manufacturing process according to an embodiment of the invention.

FIG. 3 is a depiction of integrated circuit 100 at a point in its manufacturing process following the performance of step 205 of method 200. As illustrated in FIG. 3, and as alluded to above, integrated circuit 100 at the depicted stage in the manufacturing process includes semiconducting substrate 120 and plurality of wiring layers 130. Layer 137 has been patterned to include via structures 310.

A step 210 of method 200 is to deposit a first barrier layer over the first wiring layer. As an example, the first barrier layer can be similar to barrier layer 111 that is shown in FIG. 1.

Figure 4:
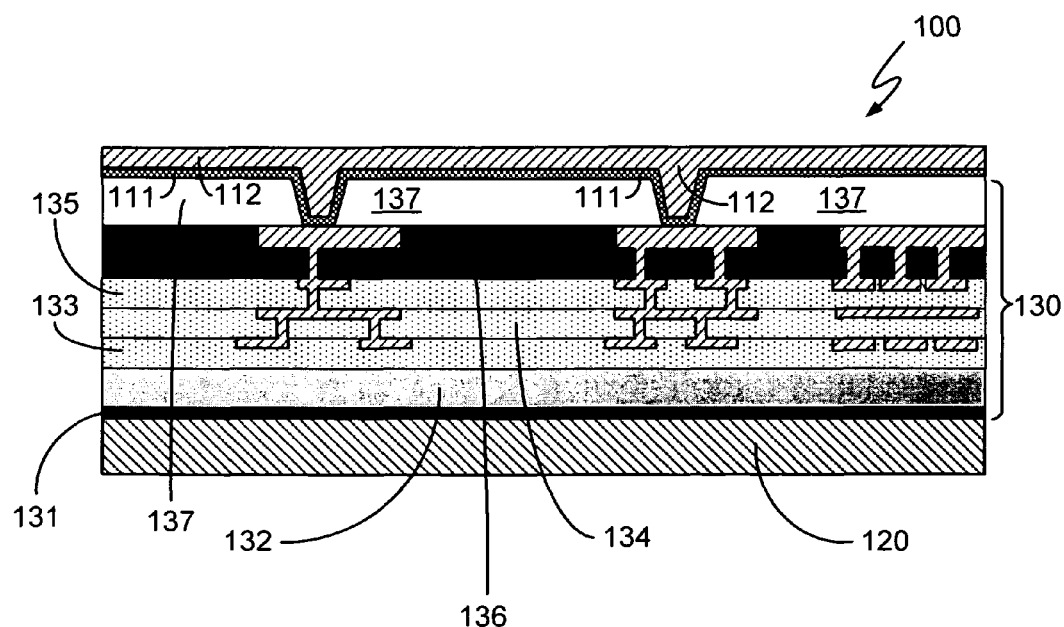

A step 215 of method 200 is to deposit a first metal layer over the first barrier layer. As an example, the first metal layer can be similar to metal layer 112 that is shown in FIG. 1. Accordingly, in one embodiment the first metal layer has a thickness of approximately 2 microns. FIG. 4 is a depiction of integrated circuit 100 at a point in its manufacturing process following the performance of step 215 of method 200. In one embodiment, steps 210 and 215 are performed simultaneously by depositing a stack comprising both the barrier layer and the first metal layer using physical vapor deposition (PVD) or similar thin film deposition processes that are well known in the art. In the same or another embodiment, step 215 comprises orienting the first metal layer in a first direction.

Figure 5:
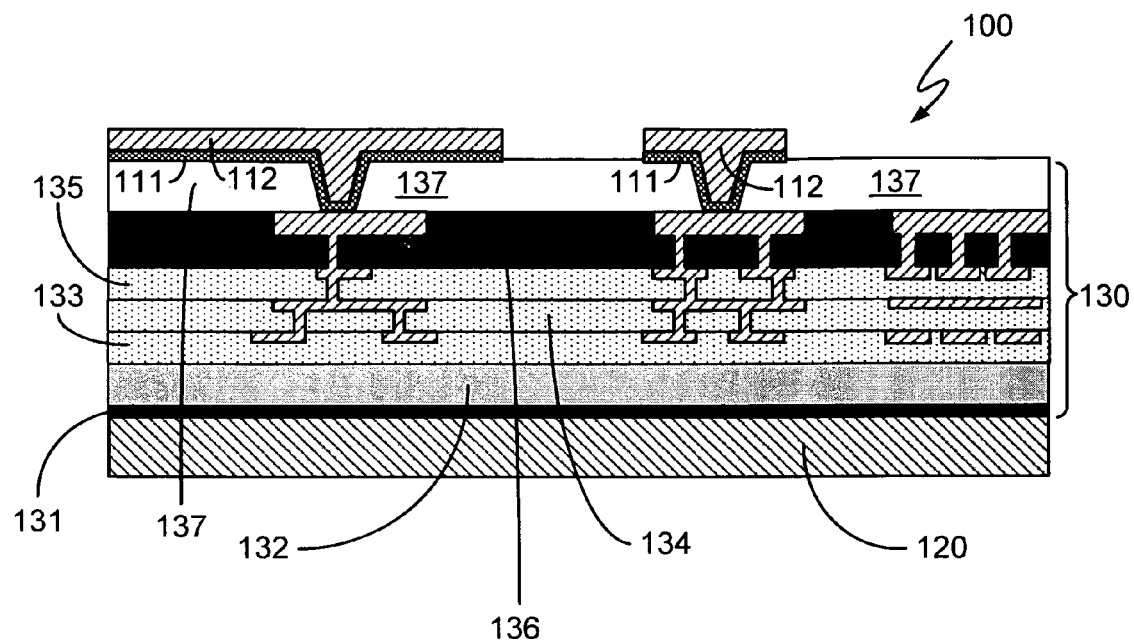

A step 220 of method 200 is to remove a portion of the first metal layer. As illustrated in FIG. 5, metal layer 112 has been patterned and etched in order to provide it with the depicted pattern. In one embodiment, step 220 comprises using a spin-expose-develop process to form a resist layer that exposes the portion of the first metal layer, etching the portion of the first metal layer using a wet etch process, and then stripping the resist layer. As an example, in the case where the first metal layer comprises copper, the first metal layer may be etched using an etch chemistry comprising $Fe^{3+}$, such as ferric chloride, an etch chemistry comprising a sulfuric acid/hydrogen peroxide mixture, or the like. As another example, the resist layer may be stripped using a wet chemical-type resist stripper solution.

A step 225 of method 200 is to remove a portion of the first barrier layer. FIG. 5 is a depiction of integrated circuit 100 at a point in its manufacturing process following the performance of step 225 of method 200. A wet or a dry etch may be used for this process. It should be noted that in at least one embodiment this etch process needs to selectively etch the barrier metal (of the first barrier layer) while leaving the copper or other metal of the first metal layer and the nitride or other material of the first passivation layer (addressed below in step 230) substantially unaffected. In one embodiment, as mentioned above, the first barrier layer comprises Ti, and either dilute hydrofluoric acid or a fluorine-based plasma is used to remove a portion of the first barrier layer. Because the first metal layer acts as the barrier layer etch mask, the barrier layer etch is self-aligning to the overlying metal of the first metal layer.

A step 230 of method 200 is to deposit a first passivation layer over the first metal layer. As an example, the first passivation layer can be similar to passivation layer 113 that is shown in FIG. 1. In one embodiment, step 230 comprises blanket depositing a silicon nitride passivation film over the first metal layer using a plasma-enhanced chemical vapor deposition (PECVD) process.

Figure 6:
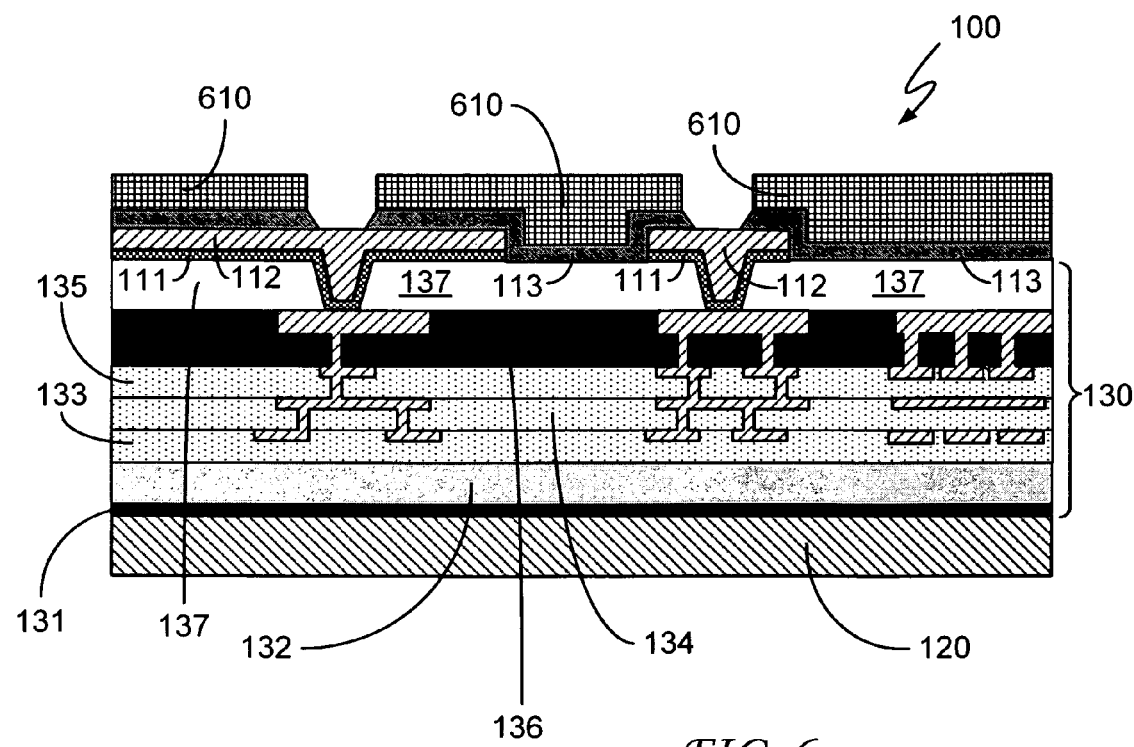

A step 235 of method 200 is to etch a via structure in the first passivation layer. As an example, the via structure can be similar to via structure 114 that is shown in FIG. 1. FIG. 6 is a depiction of integrated circuit 100 at a point in its manufacturing process following the performance of step 235 of method 200. FIG. 6 further illustrates a resist 610 that may in one embodiment be used during the performance of step 235. Resist 610 would subsequently be removed, for example by using a wet chemical stripper or a plasma ash process or the like. In one embodiment, step 235 is performed using a fluorine-based plasma etch process.

A step 240 of method 200 is to deposit a second barrier layer over the first passivation layer and in the via structure. As an example, the second barrier layer can be similar to barrier layer 115 that is shown in FIG. 1. Beginning with step 240, existing thick metallization fabrication processing may be used to form the remainder of thick metallization structure 110 along with portions of the remaining integrated circuit 100 structure, as further described below. It should be noted that portions of the underlying structure (e.g., metal layer 112 and passivation layer 113) create some topography that metal layer 116 must contend with, but given the capabilities of the existing thick metallization fabrication process (especially the ability of the spin-on dielectric to form a planar film over severe topography) this is not expected be an issue.

A step 245 of method 200 is to deposit a second metal layer over the second barrier layer. As an example, the second metal layer can be similar to metal layer 116 that is shown in FIG. 1. Accordingly, in one embodiment the second metal layer has a thickness of approximately 7 microns. In the same or another embodiment, step 245 comprises orienting the second metal layer in a second direction that is substantially perpendicular to the first direction in which the first metal layer is oriented (see step 215), with the result that (in one embodiment) the integrated circuit contains orthogonal power lines.

A step 250 of method 200 is to deposit a second passivation layer over the second metal layer and the first passivation layer. As an example, the second passivation layer can be similar to passivation layer 17 that is shown in FIG. 1.

A step 255 of method 200 is to deposit an electrically insulating material over the second passivation layer. As an example, the electrically insulating material can be similar to electrically insulating material 140 that is shown in FIG. 1. In one embodiment, step 255 comprises depositing a photodefinable spin-on dielectric material such as InterVia™ 8000-series photodefinable dielectric materials from Rohm and Haas; Cyclotene™ 4000-series photodefinable dielectric materials from Dow Chemical; SU-8 photodefinable epoxy materials from Microchem; WL-5000 series photodefinable silicone dielectric materials from Dow Corning; Avatrel® photodefinable dielectric materials from Promerus; SINR-series photodefinable dielectric materials from ShinEtsuMicroSi; SUMIRESIN EXCEL® CRC-8600 series photodefinable dielectric materials from Sumitomo Bakelite Co, Ltd.; AP2210, AN-3310 and Durimide 7000-series photodefinable polyimide materials from FujiFilm; Photoneece™ photodefinable polyimide materials from Toray; Pimel™ photodefinable polyimide materials from Asahi Kasei EMD; photodefinable polyimide materials from HD Microsystems; TMMR S2000 photodefinable dielectric material from Tokyo Ohka Kogyo Co. Ltd.; or WPR-series photodefinable dielectric materials from JSR Micro, Inc.

A step 260 of method 200 is to etch a second via structure in the electrically insulating material and the second passivation layer. As an example, the second via structure can be similar to via structure 150 that is shown in FIG. 1. In one embodiment, the electrically insulating material comprises a photodefinable dielectric material and step 260 comprises etching the via structure using the developer chemical recommended by the specific photodefinable dielectric material supplier.

A step 265 of method 200 is to deposit a third barrier layer over the electrically insulating material and in the second via structure. As an example, the third barrier layer can be similar to barrier layer 160 that is shown in FIG. 1.

A step 270 of method 200 is to form an electrically conducting bump over the third barrier layer. As an example, the electrically conducting bump can be similar to electrically conducting bump 170 that is shown in FIG. 1. Following the performance of step 270 of method 200, integrated circuit 100, at least in one embodiment, has the form depicted in FIG. 1.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the multi-layer thick metallization structure and related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of manufacturing an integrated circuit comprising:
    providing a semiconducting substrate having a plurality of wiring layers, including a first wiring layer, formed thereon;
    depositing a first barrier layer over the first wiring layer;
    depositing a first metal layer over the first barrier layer;
    removing a portion of the first metal layer;
    removing a portion of the first barrier layer;
    depositing a first passivation layer over the first metal layer; and
    etching a via structure in the first passivation layer.

2. The method of manufacturing an integrated circuit according to claim 1 further comprising:
    depositing a second barrier layer over the first passivation layer and in the via structure;
    depositing a second metal layer over the second barrier layer;
    depositing a second passivation layer over the second metal layer and the first passivation layer;
    depositing an electrically insulating material over the second passivation layer;
    etching a second via structure in the electrically insulating material and the second passivation layer;
    depositing a third barrier layer over the electrically insulating material and in the second via structure; and
    forming an electrically conducting bump over the third barrier layer.

3. The method of manufacturing an integrated circuit according to claim 2 wherein:
    depositing the second metal layer comprises causing the second metal layer to have a thickness of approximately 7 microns.

4. The method of manufacturing an integrated circuit according to claim 2 wherein:
    depositing the electrically insulating material comprises forming a spin-on polymer dielectric material.

5. The method of manufacturing an integrated circuit according to claim 2 further comprising:
    orienting the first metal layer in a first direction; and
    orienting the second metal layer in a second direction that is substantially perpendicular to the first direction.

6. The method of manufacturing an integrated circuit according to claim 1 wherein:
    depositing the first barrier layer and depositing the first metal layer are performed simultaneously by depositing a stack comprising both the first barrier layer and the first metal layer.

7. The method of manufacturing an integrated circuit according to claim 1 wherein:
    removing the portion of the first metal layer comprises:
    using a spin-expose-develop process to form a resist layer that exposes the portion of the first metal layer;
    etching the portion of the first metal layer using a wet or dry etch process; and
    stripping the resist layer.

8. The method of manufacturing an integrated circuit according to claim 1 wherein:
    etching the via structure is performed using a fluorine-based plasma etch process.

9. The method of manufacturing an integrated circuit according to claim 1 wherein:
    depositing the first barrier layer comprises depositing titanium;
    depositing the first metal layer comprises depositing copper; and
    depositing the first passivation layer comprises depositing silicon nitride.

10. The method of manufacturing an integrated circuit according to claim 1 wherein:
    depositing the first metal layer comprises causing the first metal layer to have a thickness of approximately 2 microns.

* * * * *